(12) United States Patent
Han et al.

(10) Patent No.: US 10,496,591 B2
(45) Date of Patent: Dec. 3, 2019

(54) CONVERTING A MODE CONTROLLING DIFFERENTIAL SIGNAL IN A DRIVE CIRCUIT AND A DRIVING METHOD

(71) Applicant: HUAWEI TECHNOLOGIES CO., LTD., Shenzhen (CN)

(72) Inventors: Junming Han, Shanghai (CN); Bingzhao Zhang, Shanghai (CN); Jie Peng, Shanghai (CN); Yongwang Liu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 104 days.

(21) Appl. No.: 15/847,555

(22) Filed: Dec. 19, 2017

(65) Prior Publication Data

US 2018/0173670 A1 Jun. 21, 2018

(30) Foreign Application Priority Data

Dec. 20, 2016 (CN) .......................... 2016 1 1186421

(51) Int. Cl.
*G06F 13/42* (2006.01)
*G06F 3/06* (2006.01)
(Continued)

(52) U.S. Cl.
CPC ...... *G06F 13/4282* (2013.01); *G06F 13/4072* (2013.01); *H03F 3/45179* (2013.01); *H03F 2203/45276* (2013.01)

(58) Field of Classification Search
None
See application file for complete search history.

(56) References Cited

U.S. PATENT DOCUMENTS 7,598,779 B1 10/2009 Wang et al.
8,416,005 B2 4/2013 Luo et al.
(Continued)

FOREIGN PATENT DOCUMENTS

| CN | 1920879 A | 2/2007 |
| CN | 103023505 A | 4/2013 |
| CN | 105099002 A | 11/2015 |

OTHER PUBLICATIONS

Machine Translation and Abstract of Chinese Publication No. CN103023505, Apr. 3, 2013, 15 pages.
(Continued)

*Primary Examiner* — Scott C Sun
(74) *Attorney, Agent, or Firm* — Conley Rose, P.C.

(57) ABSTRACT

A drive circuit for a serial communications system is provided. The drive circuit may include a mode controller, a pre-drive circuit, and a main drive circuit. The main drive circuit includes multiple mode control switches and at least one pair of differential switches. The mode controller is configured to: generate a mode control signal, and transmit the mode control signal to the main drive circuit. The pre-drive circuit is configured to: convert a differential digital signal into a differential control signal, and transmit the differential control signal to the main drive circuit. The main drive circuit controls on/off states of the multiple mode control switches according to the mode control signal, and works in corresponding working modes. The drive circuit controls the states of the mode control switches in the main drive circuit, so that the main drive circuit works in different working modes.

20 Claims, 8 Drawing Sheets

(51) Int. Cl.
*G06F 13/40* (2006.01)
*H03F 3/45* (2006.01)

(56) References Cited

U.S. PATENT DOCUMENTS

| | | |
|---|---|---|
| 8,823,414 B2 | 9/2014 | Thirugnanam et al. |
| 2010/0201340 A1* | 8/2010 | Raghavan ........ H03K 19/01852 |
| | | 323/311 |
| 2012/0075902 A1 | 3/2012 | MacWilliams et al. |
| 2015/0378950 A1* | 12/2015 | Cox ...................... G06F 13/385 |
| | | 710/14 |
| 2017/0018969 A1 | 1/2017 | Zhang et al. |

OTHER PUBLICATIONS

Foreign Communication From a Counterpart Application, Chinese Application No. 201611186421.3, Chinese Office Action dated Jun. 27, 2019, 6 pages.

\* cited by examiner

CONVERTING A MODE CONTROLLING DIFFERENTIAL SIGNAL IN A DRIVE CIRCUIT AND A DRIVING METHOD

CROSS-REFERENCE TO RELATED APPLICATION

This application claims priority to Chinese Patent Application No. 201611186421.3, filed on Dec. 20, 2016, which is hereby incorporated by reference in its entirety.

TECHNICAL FIELD

The present disclosure relates to the field of electronic technologies, and in particular, to a drive circuit and driving method for a serial communications system.

BACKGROUND

As communications technologies develop continuously, there is an increasingly demand for higher and higher data transmission speed. Compared with a parallel data transmission manner, serial data transmission is characterized by a higher data transmission speed. Therefore, a serial communication manner is widely used.

A drive circuit is a core module of a serial communications system, and is configured to convert an input high-speed digital logical level signal into a low-swing differential signal and output the low-swing differential signal, so as to transmit a high-speed signal to a remote receive end. Drive parameters of a drive circuit vary in different transmission protocol standards. For example, in one system, different transmission protocol standards are used for a drive circuit and a receiver circuit. In this application scenario, the drive circuit needs to be compatible with different transmission protocol standards.

An existing drive circuit can support only one transmission protocol standard. If a system needs to support multiple transmission protocol standards, multiple corresponding drive circuit interface chips need to be welded to a circuit board. This causes a complex system layout and high costs. In addition, multiple chips reduce system reliability.

SUMMARY

In view of this, this application is to provide a drive circuit and driving method for a serial communications system, so as to resolve technical problems that a conventional drive circuit with multiple welded drive circuit interface chips has a complex layout, high costs, and low reliability. Technical solutions are as follows.

According to a first aspect, this application provides a drive circuit for a serial communications system, including a mode controller, a pre-drive circuit, and a main drive circuit. The main drive circuit includes multiple mode control switches and at least one pair of differential switches. The mode controller is configured to: generate a mode control signal, and transmit the mode control signal to the main drive circuit, where the mode control signal is used to control a working mode of the main drive circuit. The pre-drive circuit is configured to: convert a received differential digital signal into a differential control signal used to control the at least one pair of differential switches, and transmit the differential control signal to the main drive circuit. The main drive circuit is configured to: control, according to the mode control signal, the multiple mode control switches to be in an on or off state, so that the main drive circuit works in a working mode corresponding to the mode control signal. The main drive circuit is further configured to control, according to the differential control signal, the at least one pair of differential switches to be in an on or off state, and convert the differential digital signal into a drive signal in a working mode corresponding to the mode control signal.

The drive circuit controls the states of the mode control switches in the main drive circuit, so that the main drive circuit works in different working modes. Therefore, only one chip is needed to support different transmission protocol standards, with a simple layout, low costs, and high reliability.

According to a second aspect, this application provides a driving method for a serial communications system, including: obtaining, by a drive circuit, a mode control instruction, and converting the mode control instruction into a mode control signal; and controlling, by the drive circuit according to the mode control signal, a mode control switch in the drive circuit to be in an on or off state, so that the drive circuit works in a working mode corresponding to the mode control instruction.

According to the driving method, the states of the mode control switches in the main drive circuit are controlled, so that the main drive circuit works in different working modes. Therefore, only one chip is needed to support different transmission protocol standards, with a simple layout, low costs, and high reliability.

According to a third aspect, the application provides method for driving a drive circuit that includes: a mode controller, a pre-drive circuit, and a main drive circuit, wherein the main drive circuit comprises multiple mode control switches and at least one pair of differential switches. The drive circuit is configured to provide different drive signals in a plurality of working modes. The method includes: generating, by the mode controller, a mode control signal, and transmitting the mode control signal to the main drive circuit, wherein the mode control signal indicates a working mode of the main drive circuit; converting, by the pre-drive circuit, a received differential digital signal into a differential control signal configured to control the at least one pair of differential switches, and transmitting the differential control signal to the main drive circuit; controlling, by the main drive circuit, according to the mode control signal, the multiple mode control switches to cause the main drive circuit to work in one of the plurality of working modes corresponding to the mode control signal; and controlling, by the main drive circuit, the at least one pair of differential switches according to the differential control signal, and converting the differential digital signal into a drive signal in the working mode corresponding to the mode control signal.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
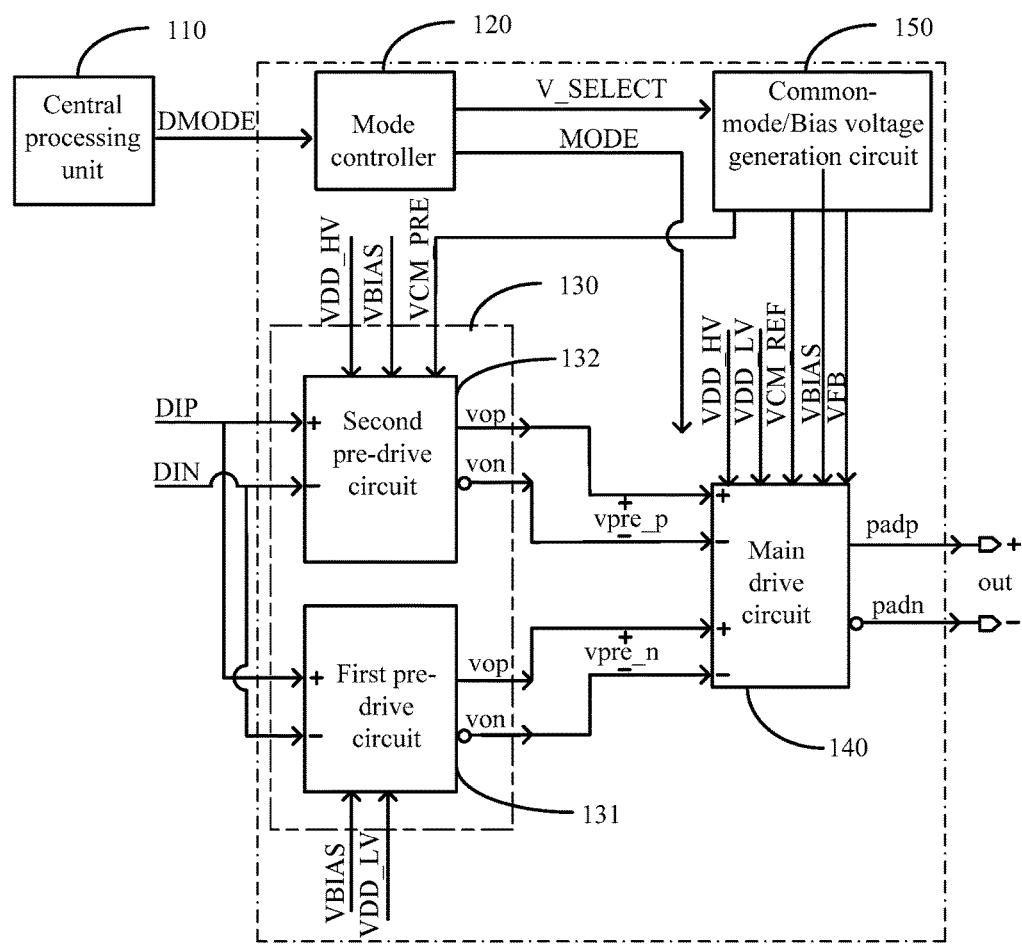
FIG. 1 is a schematic principle diagram of a drive circuit for a serial communications system according to an aspect of the present disclosure.

Referring to FIG. 1, FIG. 1 is a schematic principle diagram of a drive circuit for a serial communications system according to an aspect of the present disclosure. The drive circuit includes a central processing unit 110, a mode controller 120, a pre-drive circuit module 130, a main drive circuit 140, and a common-mode/bias voltage generation circuit 150.

An output end of the central processing unit 110 is connected to an input end of the mode controller 120, a first output end of the mode controller 120 is connected to a control end of the main drive circuit 140, and an output end of the main drive circuit 140 is connected to a load 160.

In a possible implementation of this application, the pre-drive circuit module 130 includes a first pre-drive circuit 131 and a second pre-drive circuit 132, and input ends of the two pre-drive circuits receive a differential digital signal DIP/DIN. The differential digital signal is converted from a to-be-transmitted digital signal in the serial communications system. An output end of the first pre-drive circuit 131 is connected to a control end of a differential switch of a lower common-mode voltage in the main drive circuit 140. An output end of the second pre-drive circuit 132 is connected to a control end of a differential switch of a higher common-mode voltage in the main drive circuit 140.

A working principle of the drive circuit provided in this embodiment is as follows.

A user selects a working mode. The central processing unit 110 generates a corresponding mode control instruction DMODE after detecting a selection operation of the user, where the DMODE instruction is a digital control signal; and provides the DMODE instruction for the mode controller 120. The mode controller 120 converts the DMODE signal into a mode control signal MODE. The MODE is an analog signal. In addition, the MODE is a generic term of control signal sets used to control on/off states of multiple mode control switches, and includes one or more control signals.

The mode control signal MODE is used to control multiple mode control switches in the main drive circuit 140 to be turned on or turned off, so that the main drive circuit 140 works in a specific working mode and outputs a drive parameter complying with a transmission protocol standard. The following details different working modes of the main drive circuit.

The first pre-drive circuit 131 is configured to convert a high-speed differential digital signal DIP/DIN into a first differential control signal vpre_n, so as to control an on/off state of a differential switch of a lower common-mode voltage in the main drive circuit 140. The second pre-drive circuit 132 is configured to convert a high-speed differential digital signal DIP/DIN into a second differential control signal vpre_p, so as to control an on/off state of a differential switch of a higher common-mode voltage in the main drive circuit 140.

The common-mode/bias voltage generation circuit 150 is configured to: provide a first reference common-mode voltage and a bias voltage for the main drive circuit 140, and provide a second reference common-mode voltage for the pre-drive circuit 130. In this way, a common-mode voltage of the main drive circuit 140 is equal to the first reference common-mode voltage, and a common-mode voltage of the pre-drive circuit 130 is equal to the input second reference common-mode voltage, so that the common-mode voltage of the drive circuit that works in a specific working mode is adjustable. The bias voltage is used to make values of currents generated by the main drive circuit 140 and the pre-drive circuit 130 adjustable.

The drive circuit for the serial communications system that is provided in this embodiment includes the mode controller, the pre-drive circuit, and the main drive circuit, where the main drive circuit includes the multiple mode control switches and at least one pair of differential switches. The mode controller is configured to: generate the mode control signal, and transmit the mode control signal to the main drive circuit. The pre-drive circuit is configured to: convert the received differential digital signal into the differential control signal, and transmit the differential control signal to the main drive circuit. The main drive circuit controls, according to the mode control signal, the multiple mode control switches to be in an on or off state, so that the main drive circuit works in a working mode corresponding to the mode control signal. In addition, the main drive circuit controls, according to the differential control signal, the at least one pair of differential switches to be in an on or off state, and converts the differential digital signal into a drive signal corresponding to a current working mode. The drive circuit controls the states of the mode control switches in the main drive circuit, so that the main drive circuit works in working modes corresponding to different transmission protocol standards. Therefore, only one chip is needed to support different transmission protocol standards, with a simple layout, low costs, and high reliability.

The following details, with reference to the accompanying drawings, the circuit modules shown in FIG. 1.

Figure 2:
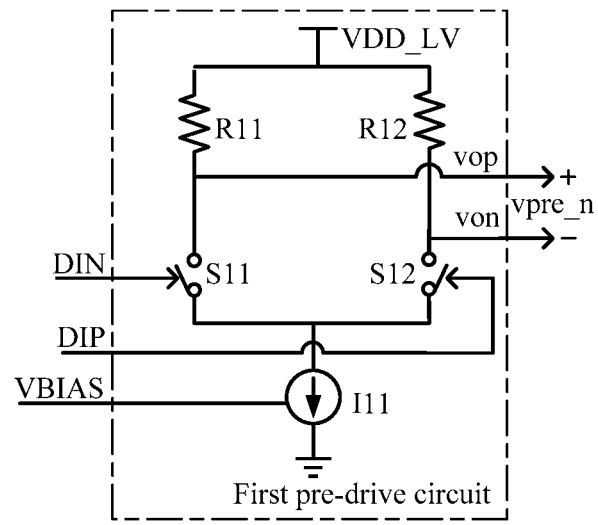
FIG. 2 is a schematic circuit diagram of a first pre-drive circuit according to an aspect of the present disclosure.

Referring to FIG. 2, FIG. 2 is a schematic circuit diagram of a first pre-drive circuit according to an aspect of the present disclosure. As shown in FIG. 2, the first pre-drive circuit includes resistors R11 and R12, a pair of differential switches S11 and S22, a current source I11, a supply voltage VDD_LV (that is, a second power source), and a bias voltage VBIAS. Resistances of both the R11 and the R12 are R1, and a current value of the current source I11 is I1.

The current source I11 may be implemented by using a N-channel metal-oxide-semiconductor (NMOS) transistor. A source and a substrate of the NMOS transistor are grounded, a drain of the NMOS transistor is connected to the two differential switches S10 and S12, and a gate of the NMOS transistor is connected to the VBIAS. The bias voltage VBIAS is generated by the common-mode/bias voltage generation circuit 150.

A DIN is input to a control end of the switch S11, and a DIP is input to a control end of the S12. The DIN and the DIP are a group of high-speed differential digital signals. The high-speed differential digital signals are converted from low-speed parallel digital signals input to the serial communications system.

When the DIP is a positive signal and the DIN is a negative signal, the switch S12 is turned on and the switch S11 is turned off, and a path that a current in the first pre-drive circuit passes through is R12→S12→I11; in this case, vop=VDD_LV, and von=VDD_LV−I1×R1. When the DIP is a negative signal and the DIN is a positive signal, the switch S11 is turned on and the S12 is turned off, and a path that a current in the first pre-drive circuit passes through is R11→S11→I11; in this case, at an output end, vop=VDD_LV−I1×R1, and von=VDD_LV. A common-mode voltage is VDD_LV−(I1×R1)/2.

A main function of the first pre-drive circuit is to convert the received differential digital signal into a low-voltage differential voltage signal. A common-mode voltage of the low-voltage differential voltage signal is relatively low, and the low-voltage differential voltage signal is used as the first differential control signal to be transmitted to the main drive circuit 140, to control a pair of differential switches of a relatively low common-mode voltage.

Figure 3:
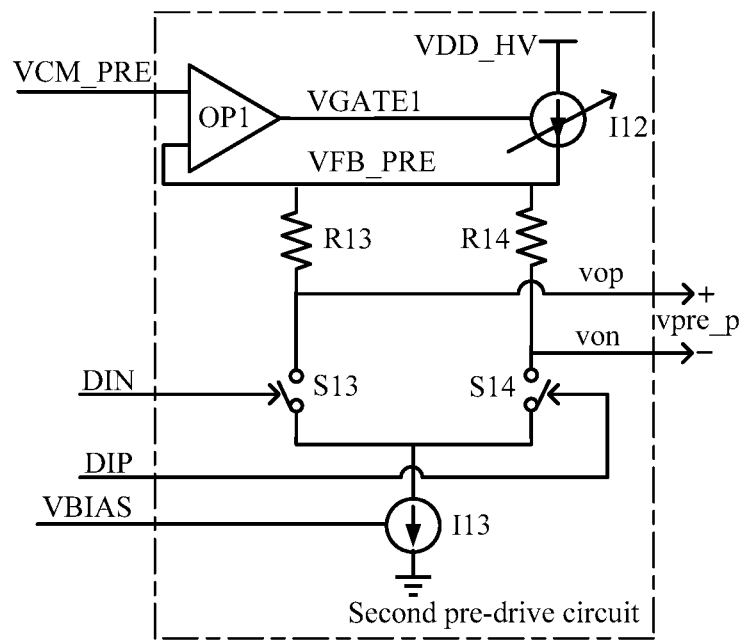
FIG. 3 is a schematic circuit diagram of a second pre-drive circuit according to an aspect of the present disclosure.

Referring to FIG. 3, FIG. 3 is a schematic circuit diagram of a second pre-drive circuit according to an aspect of the present disclosure. As shown in FIG. 3, the second pre-drive circuit includes a resistor R13 (that is, a third resistor), an R14 (that is, a fourth resistor), a differential switch S13 (that is, a fifth differential switch), an S14 (that is, a sixth differential switch), a variable current source I12 (that is, a third current source), a tail current source (that is, a fourth current source), an amplifier OP1 (that is, a third differential operational amplifier), and a supply voltage VDD_HV. Resistances of the resistors R13 and R14 are R2, and a current value of the tail current source I13 is I2.

A main function of the second pre-drive circuit is to convert an input high-speed differential digital signal (DIP/DIN) into a low-voltage differential signal, to provide the first differential control signal for a pair of differential switches of a relatively high common-mode voltage in the main drive circuit 140. A common-mode voltage of the differential signal is higher than that of the differential signal output by the first pre-drive circuit.

A control end of the differential switch S13 is connected to the DIN, and a control end of the S14 is connected to the DIP. A reference common-mode voltage VCM_PRE (the VCM_PRE is the second reference common-mode voltage, and is generated by the common-mode/bias voltage generation circuit; a voltage value is adjustable) is input to an input end of the OP1, VFB_PRE is input to the other input end of the OP1, and an output end of the OP1 is VGATE1 and is connected to a gate of the current source I12. The current source I12 is implemented by using a metal-oxide-semiconductor (MOS) transistor. The OP1, the I12, and a connection line between the OP1 and the I12 form a negative feedback loop, and a negative feedback characteristic of the negative feedback loop makes the VFB_PRE roughly equal to the VCM_PRE. In addition, to make a voltage of a signal (vpre_p), output by the second pre-drive circuit, of a relatively high common-mode voltage higher than the low-voltage supply voltage VDD_LV, a voltage value of the VFB_PRE (that is, the VCM_PRE) needs to be higher than the low-voltage supply voltage VDD_LV. Therefore, VDD_HV needs to be used as the supply voltage.

When the DIP is a positive signal and the DIN is a negative signal, and the switch S14 is turned on and the S13 is turned off, and a path that a current in the second pre-drive circuit passes through is I12→R14→S14→I13; in this case, vop=VFB_PRE=VCM_PRE, and von=(VCM_PRE−I2×R2). When the DIP is a negative signal and the DIN is a positive signal, the switch S13 is turned on and the S14 is turned off, and a path that a current in the second pre-drive circuit passes through is I12→R13→S13→I13; in this case, vop=(VCM_PRE−I2×R2), and von=VCM_PRE. A common-mode voltage of the second pre-drive circuit is VCM_PRE−(I2×R2)/2.

The common-mode voltage output by the second pre-drive circuit provided in this embodiment is VCM_PRE−(I2×R2)/2, a high level output by the output end is VCM_PRE, and a low level is (VCM_PRE−I2×R2). A voltage value of the VCM_PRE is adjustable, so that the differential switch of a higher common-mode voltage in the main drive circuit works properly. In addition, adjustability of the voltage value of the VCM_PRE can satisfy different VCM_REF requirements (the higher the VCM_REF is, the higher the required VCM_PRE is).

Figure 4:
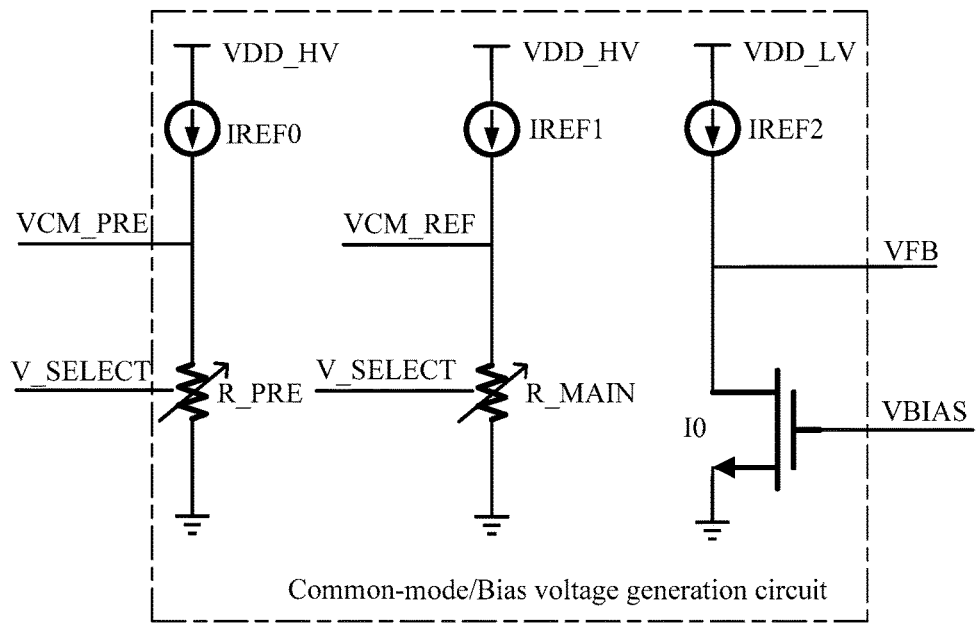
FIG. 4 is a schematic circuit diagram of a common-mode/bias voltage generation circuit according to an aspect of the present disclosure.

Referring to FIG. 4, FIG. 4 is a schematic circuit diagram of a common-mode/bias voltage generation circuit according to an aspect of the present disclosure. As shown in FIG. 4, the circuit is configured to generate a reference common-mode voltage VCM_PRE of the pre-drive circuit, a reference common-mode voltage VCM_REF of the main drive circuit, and bias voltages VBIAS and VFB.

A second reference voltage (VCM_PRE) generation circuit includes a supply voltage VDD_HV and a variable resistor R_PRE. According to Ohm's law, it can be obtained that VCM_PRE=IREF0×R_PRE. IREF0 is a reference current provided by another circuit module for the common-mode/bias voltage generation circuit, and R_PRE is a variable resistor. A resistance of the variable resistor is adjusted according to V_SELECT, so that reference common-mode voltages VCM_PREs with different voltage values are generated.

A first reference voltage (VCM_REF) generation circuit is the same as the second reference voltage generation circuit, that is, VCM_REF=IREF1×R_MAIN. Reference currents with a same current value are used, that is, IREF1=IREF0.

The bias voltage generation circuit includes a supply voltage VDD_LV, a reference current source IREF2 (that is, the first reference current source), and an NMOS transistor 10 (that is, a fifth current source). This part of circuit needs to cooperate with the main drive circuit 140 to generate bias voltage VBIAS (that is, a first bias voltage) and VFB (that is, a second bias voltage) signals. A function implementation of this part of circuit is detailed in analysis of a mode 1 of the main drive circuit.

Figure 5:
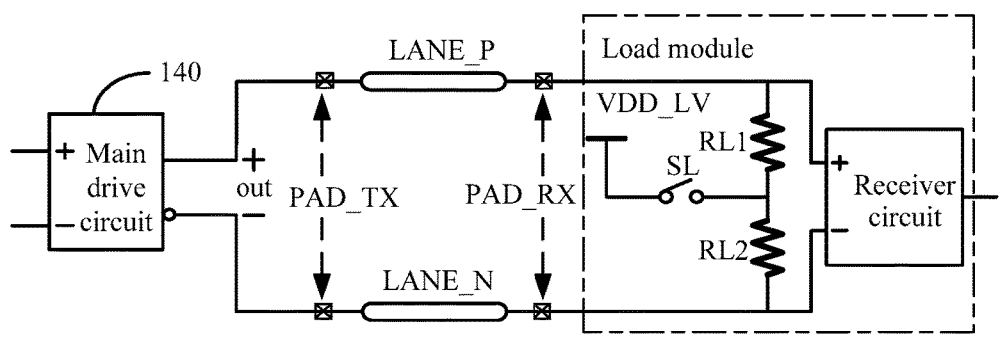
FIG. 5 is a schematic circuit diagram of a load module according to an aspect of the present disclosure.

Referring to FIG. 5, FIG. 5 is a schematic circuit diagram of a load module according to an aspect of the present disclosure. As shown in FIG. 5, the load module is a remote receiver circuit. A current signal output by the drive circuit needs to be transmitted to the receiver circuit, so that a high-speed signal is transmitted to a remote receive end.

An output end of the main drive circuit 140 passes through a package pin PAD_TX at a drive end, a PCB layout: LANE_P/LANE_N, and a package pin PAD_RX at a receive end. A drive current output by the drive circuit is transmitted to a load resistor RL1/RL2 at an input end of the receiver circuit.

As shown in FIG. 5, the load module includes an RL1, an RL2, an SL, and a receiver chip RX. There are two load configurations for the load module. One configuration is: The switch SL is turned off, a load resistance RL=RL1+RL2, and a resistance of the RL is set according to a transmission protocol standard and is generally set to 100Ω. The other configuration is: The switch SL is turned on, a load is two pull-up resistors and is connected to the supply voltage VDD_LV, RL=RL1=RL2, and a resistance of the RL is set according to a transmission protocol standard and is generally 50Ω approximately. A control signal of the switch SL in the part of the load module and a mode control signal MODE of the drive circuit are cooperated, so that the main drive circuit can work in different working modes. In a working mode 4 described in the following, the SL is turned on; in other working modes, the SL is turned off. The following provides a detailed description.

Figure 6:
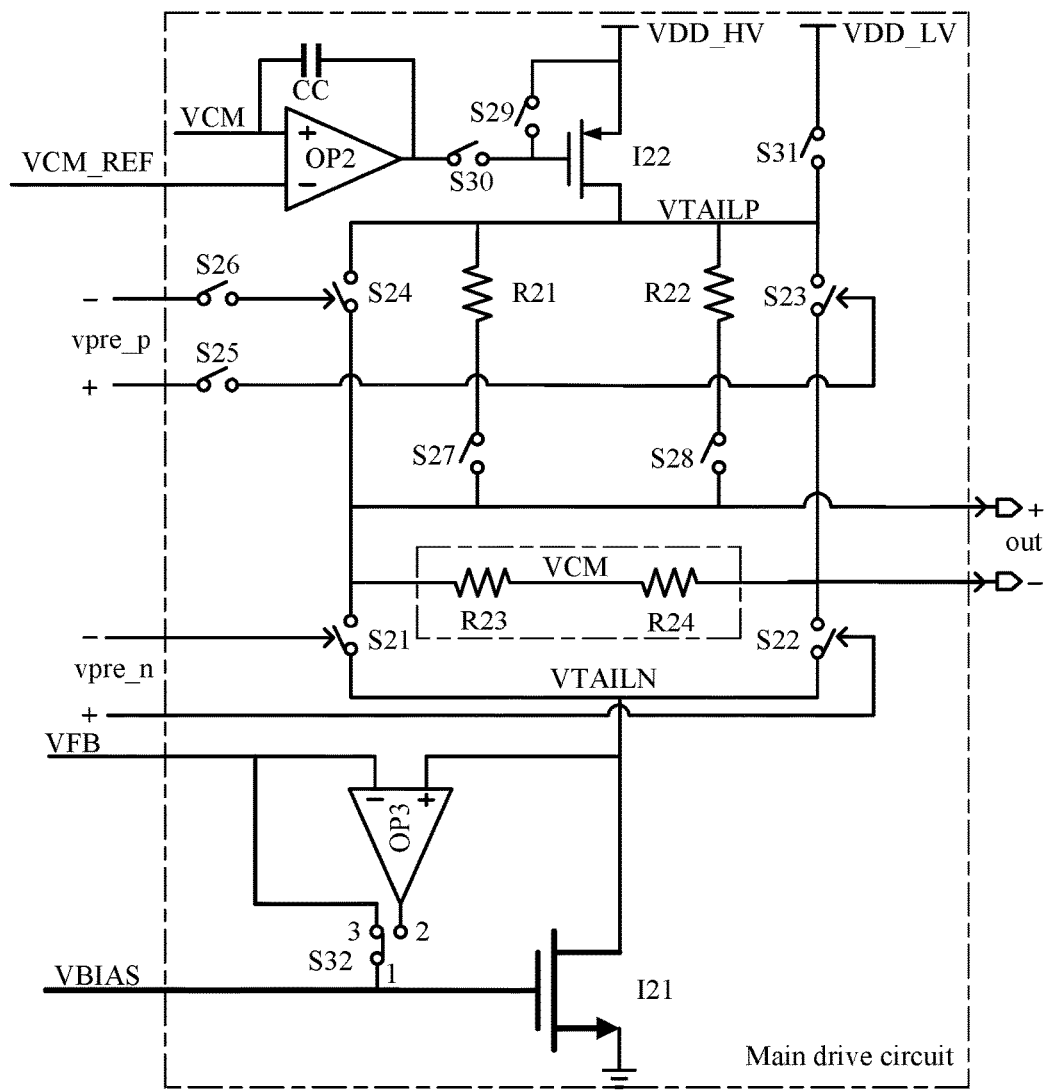
FIG. 6 is a schematic circuit diagram of a main drive circuit according to an aspect of the present disclosure.

Referring to FIG. 6, FIG. 6 is a schematic circuit diagram of a main drive circuit according to an aspect of the present disclosure. As shown in FIG. 6, the main drive circuit includes an amplifier OP2 (that is, a first differential operational amplifier), an OP3 (that is, a second differential operational amplifier), a first current source I22, a second current source I21, a resistor R21 (that is, a first resistor), an R22 (that is, a second resistor), an R23, an R24, and two pairs of differential switches: an S21 (that is, a first differential switch) and an S22 (that is, a second differential switch), and an S23 (that is, a third differential switch) and an S24 (that is, a fourth differential switch); a mode control switch includes an S25 (that is, a fourth control switch), an S26 (that is, a fifth control switch), an S27 (that is, a sixth control switch), an S28 (that is, a seventh control switch), an S29 (that is, a second control switch), an S30 (that is, a first control switch), an S31 (that is, a third control switch), and an S32 (that is, an eighth control switch).

Resistances of the R21 and the R22 are R2, and resistances of the R23 and the R24 are R3. The I21 is a variable current source implemented by using an NMOS transistor, and the I22 is a variable current source implemented by using a PMOS transistor.

A control end of the S21 and a control end of the S22 are connected to the output end of the first pre-drive circuit, and a common-mode voltage required by this pair of differential switches is relatively low. A control end of the S23 and a control end of the S24 are connected to the output end of the second pre-drive circuit, and a common-mode voltage required by this pair of differential switches is relatively high.

States of switches of different switch combinations of S25 to S32 are controlled, so that the main drive circuit works in different working modes and supports different transmission protocol standards. The main drive circuit provided in this application includes four working modes, and switch states of the mode control switch are listed in Table 1.

TABLE 1

| MODE | S21/S22 | S23/S24 | S25/S26 | S27/S28 | S29 | S30 | S31 | SL |
|---|---|---|---|---|---|---|---|---|
| Mode 1 | Differential | Differential | On | Off | Off | On | Off | Off |
| Mode 2 | Differential | Off | Off | On | Off | On | Off | Off |
| Mode 3 | Differential | Off | Off | On | On | Off | On | Off |
| Mode 4 | Differential | Off | Off | Off | Off | Off | Off | On |

It should be noted that, if the receiver circuit is not in a circuit structure shown in FIG. 5, that is, no SL is disposed in the receiver circuit, the receiver circuit is a load when the SL is turned off or a load when the SL is turned on. If the receiver circuit is a load when the SL is turned off, any mode may be selected from the modes 1 to 3 for the drive circuit. If the receiver circuit is a load when the SL is turned on, a working mode of the drive circuit is the mode 4.

The following separately details, with reference to the accompanying drawings, different working modes of the main drive circuit.

Figure 7:
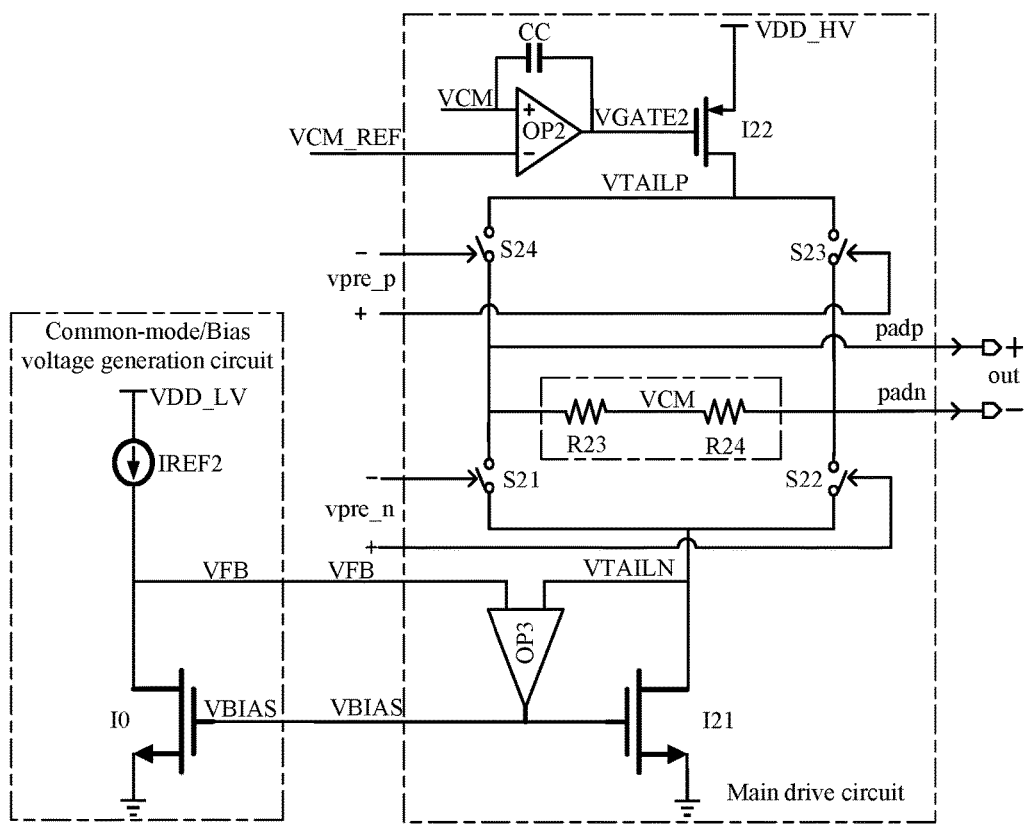
FIG. 7 is a schematic circuit diagram corresponding to a working mode 1 of a main drive circuit according to an aspect of the present disclosure.

Referring to FIG. 7, FIG. 7 is a schematic circuit diagram corresponding to a working mode 1 of a main drive circuit according to an aspect of the present disclosure.

The mode control signal MODE in FIG. 1 is used to control the mode control switches S25, S26, and S30 in FIG. 6 to be turned on, and control the S27, S28, S29, and S31 to be turned off; the single-pole, double-throw switch S32 chooses to connect an output end of the OP3 to the VBIAS; the SL is turned off. A simplified main drive circuit in the working mode is shown in FIG. 7.

It is implemented that a source of the PMOS transistor of the current source I22 is connected to the supply voltage VDD_HV (that is, a first power source), a gate of the PMOS transistor is connected to an output end VGATE2 of the OP2, a positive input end of the OP2 inputs a common-mode voltage VCM, and a negative input end of the OP2 inputs the reference common-mode voltage VCM_REF (that is, the first reference common-mode voltage).

The main drive circuit includes two groups of differential switches: the S21 and the S22, and the S23 and the S24. The voltage signal vpre_n output by the first pre-drive circuit is used to control the S21 and S22, and the voltage signal vpre_p output by the second pre-drive circuit is used to control the S23 and the S24.

The R23 and the R24 are connected to a differential output end, to form a common-mode voltage detection circuit. The resistances of the R23 and the R24 are equal and relatively large; therefore, the R23 and the R24 has very little impact on an output current and the impact may be ignored. A value of a voltage at a junction of the R23 and the R24 is the common-mode voltage VCM.

In this working mode, the OP2, the I22, the S23, the S24, the R23, and the R24 are connected to form a negative feedback loop. The negative feedback loop makes a current value of the I21 roughly equal to that of the I22. It is assumed that the current values of the I21 and the I22 are I3. In addition, the negative feedback loop makes the output common-mode voltage VCM roughly equal to the specified reference common-mode voltage VCM_REF. Therefore, The common-mode voltage output by the main drive circuit may be set by adjusting the VCM_REF.

The OP2 is a differential operational amplifier. Even a slight difference between voltages input to the two input ends of the OP2 is amplified. If VCM>VCM_REF, a voltage at the VGATE2 increases, and a voltage difference between the gate and the source of the I22 decreases. Therefore, the current in the I22 decreases and is less than that in the I21. In this case, voltages of both a padp and a padn decrease, and the VCM also decreases, making the VCM roughly equal to the VCM_REF. Likewise, when VCM<VCM_REF, the current in the I22 is greater than that in the I21, and the voltage VCM increases, making the VCM roughly equal to the VCM_REF. Therefore, the negative feedback loop makes the output VCM roughly equal to the input VCM_REF.

Likewise, if the current value of the current source I22 is relatively large, the VCM is relatively high, and the voltage at the VGATE2 increases. Therefore, the current in the current source I22 decreases. The feedback loop detects a VCM voltage to make the current value of the I22 equal to that of the I21.

In this working mode, when the vpre_p is a positive signal and the vpre_n is a negative signal, the differential switches S23 and S21 are turned on and the S24 and the S22 are turned off, a path that a drive current passes through is I22→S23→RL (a load resistor)→S21→I21, and a current value of the drive current is IOUT. When the vpre_p is a negative signal and the vpre_n is a positive signal, the differential switches S23 and S21 are turned off and the S24 and the S22 are turned on, a path that a drive current passes through is I22→S24→RL (a load resistor)→S22→I21, and a current value of the drive current is IOUT.

The drive current passes through the load resistor RL, and generates a voltage swing VSWING=IOUT×RL at a load end. If the load resistor RL is 100Ω, to generate the voltage swing VSWING, the drive current IOUT=VSWING/100. Generally, the resistance of the load resistor is fixed. To obtain a required voltage swing, a current value of the main drive circuit may be adjusted.

In the working mode 1, the VCM of the signal output by the main drive circuit may vary with the VCM_REF. For circuits with a same load, a drive current is relatively small, a gradient of an edge of a drive current signal is relatively small, and a drive speed is slow. Therefore, this working mode is applicable to a low-speed communications system.

In a possible implementation of the present disclosure, to increase a range of a common-mode voltage (VCM) of a drive signal and make a voltage swing VSWING adjustable, especially to generate a VCM of a relatively low voltage value, a non-movable end 1 of the mode control switch S32 is connected to a movable end 2 in this implementation, so that the OP3 is connected to the main drive circuit. In this way, the I0 is a mirror current source of the I21, the I21 is adjusted by adjusting the I0, and further a drive current is adjusted. This makes the voltage swing VSWING adjustable.

One input end of the OP3 is connected to a drain of the I21 (a voltage input to the input end is marked as VTAILN, that is, a second node), the other input end is connected to a drain of the I0 in the common-mode/bias voltage generation circuit 150 (a voltage input to the input end is marked as VFB), and the output end of the OP3 is connected to a gate of the I21 and a gate of the I0 (the voltage is marked as VBIAS).

The OP3 is used to form two feedback loops in opposite feedback polarities, that is, a feedback loop 1 (a positive feedback loop): VFB→OP3→VBIAS→I0, and a feedback loop 2 (a negative feedback loop): VTAILN→OP3→VBIAS→I21.

To make the two feedback loops work properly, a loop gain of the positive loop needs to be less than a loop gain of the negative feedback loop. The two feedback loops make the voltages VTAILN and the VFB that are input to the two input ends of the OP3 roughly equal, so that bias voltages at all ports of the I21 and the I0 are roughly equal. Therefore, the current in the I21 is a mirror current of a current in the I0, where the two currents are proportional. When the VCM of the output signal is relatively low, a voltage value of the VTAILN is relatively low, that is, a voltage at the drain of the I21 is relatively low. In this case, the I21 may work in a linear region, bias states of the I21 and the I0 remain the same, and the current in the I21 is still a mirror current of a current in the I0, where the two currents are proportional. Therefore, in the present disclosure, a current source transistor can still work properly in the linear region when a common-mode voltage of the circuit is relatively low. This increases a common-mode voltage range for the output signal, and is applicable to an application scenario of a relatively low common-mode voltage.

When the VCM is relatively low, the VTAILN is quite low. If there is no OP3, the NMOS transistor of the I21 enters the linear region. Even a quite small change in the voltage at the drain of the NMOS transistor leads to a great change in a current in the NMOS transistor, and a significant decrease in the VCM results in a dramatic decrease in the current in the main drive circuit. As a result, the current in the main drive circuit and the current in the I0 are not in a mirror relationship.

When the output common-mode voltage is relatively high, both the I21 and the I0 work in a saturation region. The bias voltages at all the ports of the two current sources are equal, and the current in the I21 is still a mirror current of a current in the I0, where the two currents are proportional. This reduces impact of a channel length modulation effect between the current sources I21 and I0 that occurs when the VTAILN and the VFB are different because of a change in the common-mode voltage VCM.

If the output common-mode voltage is relatively high, both the I21 and the I0 work in the saturation region, and the channel length modulation effect slightly affects the current in the I21. The non-movable end 1 of the mode control switch S32 is connected to a movable end 3, and the circuit can still work properly. In this case, the gate and the drain of the NMOS transistor I0 are connected, and a working principle of the I0 is the same as that of a diode, and the current in the I21 and the current in the I0 are in a proportional mirror relationship.

In another possible implementation of the present disclosure, to improve drive circuit stability and a power supply rejection capability, a compensation capacitor CC is connected between the VCM and the VGATE2.

The OP2 is a first-stage amplifier whose gain is A1. The I22, the S23, the S24, the R23, and the R24 are jointly used as a second-stage amplifier whose gain is A2. The CC is connected between an input end and an output end of the first-stage amplifier. The capacitor is in effect a Miller compensation capacitor. Due to a Miller effect of the capacitor, the larger the second-level amplifier is, the smaller the required compensation capacitance is.

The CC is connected between the VGATE2 and the VCM. Compared with that the CC is connected between the VGATE2 and the VTAILP (that is, a first node), this can reduce a capacitance of the compensation capacitor. If the CC is directly connected to the VTAILP node, the current source I22 (the PMOS transistor) is equivalent to a diode in case of a high frequency, because a higher frequency indicates a lower impedance of a capacitor. In this case, any change in the supply voltage VDD_HV is transmitted to the VGATE2 node, and the VTAILP and the VGATE2 are equivalent to one node in case of a high frequency, that is, a change in a voltage of the VTAILP is the same as that in the supply voltage VDD_HV. In addition, if the CC is connected to the VTAILP node, because a larger gain is obtained for the VCM compared with the VTAILP when the S23 or the S24 is turned on, the change in the supply voltage VDD_HV is amplified and then transmitted to the VCM, and consequently the VCM receives serious interference from the supply voltage. Therefore, connecting the compensation capacitor CC between the VGATE2 and the VCM can reduce an area of the compensation capacitor, and improve supply voltage interference immunity of a chip.

Figure 8:
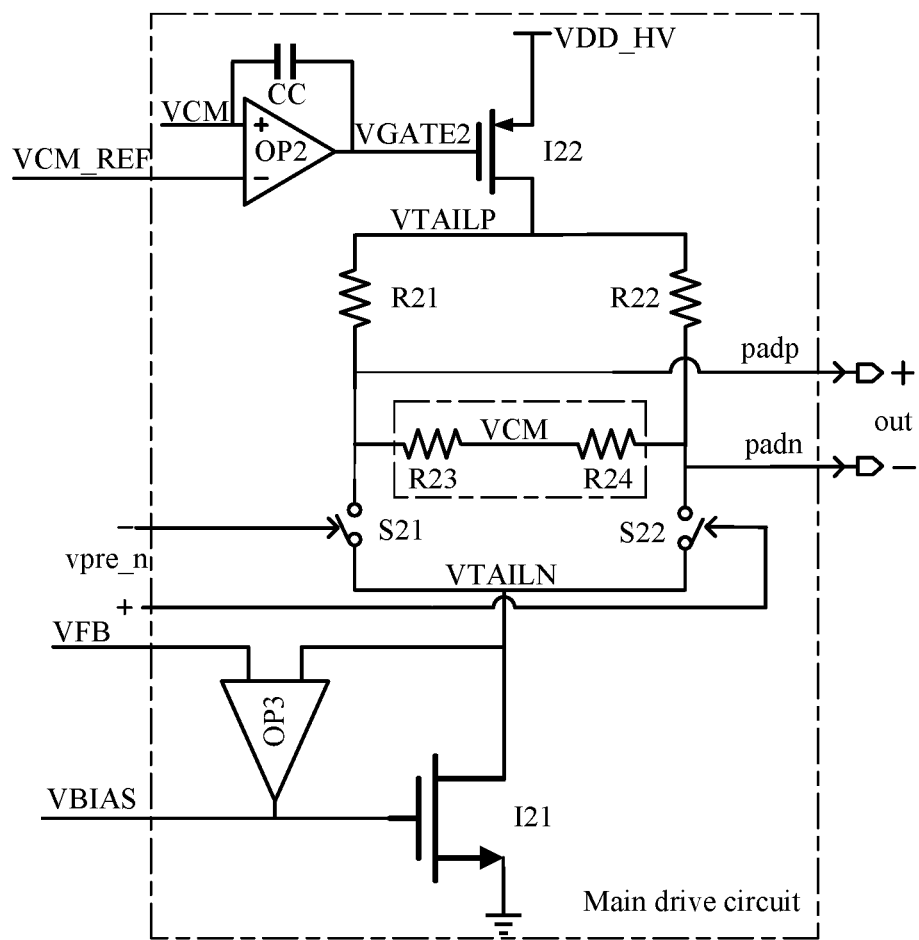
FIG. 8 is a schematic circuit diagram corresponding to a working mode 2 of a main drive circuit according to an aspect of the present disclosure.

Referring to FIG. 8, FIG. 8 is a schematic circuit diagram corresponding to a working mode 2 of a main drive circuit according to an aspect of the present disclosure.

The MODE is used to control the mode control switches S25, S26, and S29 to be turned off, and control the S27, the S28, and the S30 to be turned on; in this case, the main drive circuit works in the working mode 2. A simplified circuit in this working mode is shown in FIG. 8.

The circuit structure in the working mode 2 is the same as that in the working mode 1, except that in the working mode 2, the differential switches S23 and S24 are replaced with the R21 and the R22, and there is no differential control signal vpre_p. Compared with that in the working mode 1, a common-mode voltage VCM output by the main drive circuit in the working mode 2 may also be set by using the VCM_REF.

In addition, the circuit in the working mode 2 does not have the differential switches S23 and S24, which are replaced with the R21 and R22. When the vpre_n is a positive signal, a path that a current in the circuit passes through is IIN:I22→R22→S22→I21, and a path that a drive current in the circuit passes through is IOUT:I22→R21→RL (a load resistor)→S22→I21. When the vpre_n is a negative signal, a path that a current in the circuit passes through is IIN:I22→R21→S21→I21, and a path that a drive current in the circuit passes through is IOUT:I22→R22→RL (a load resistor)→S21→I21.

Resistances of the R21 and the R22 are equal and both are R, a current value of the I21 is set to I (that is, a total current in the main drive circuit), the drive current IOUT that passes through the load resistor RL is IR/(2R+RL), and a voltage swing VSWING generated by the current on the load resistor RL is IOUT×RL. If the load resistance RL is 100Ω and R is 50Ω, the drive current IOUT is VSWING/100, and the total current I in the circuit is 4×IOUT.

Optionally, when the mode control switch S32 is controlled to connect the OP3 to the circuit, the main drive circuit can output a relatively low VCM.

A circuit function difference between this working mode and the working mode 1 lies in: If the total current in the circuit increases, an edge of an output signal is steeper, and a drive speed is fast. Therefore, this working mode is applicable to a high-speed communications system.

Figure 9:
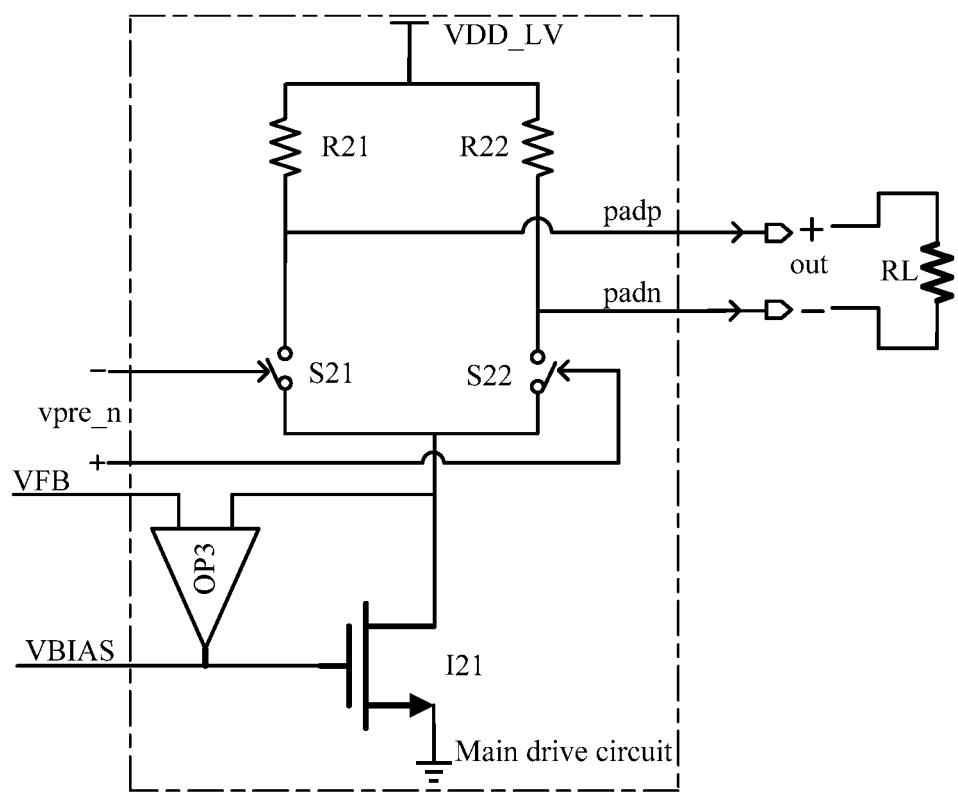
FIG. 9 is a schematic circuit diagram corresponding to a working mode 3 of a main drive circuit according to an aspect of the present disclosure.

Referring to FIG. 9, FIG. 9 is a schematic circuit diagram corresponding to a working mode 3 of a main drive circuit according to an aspect of the present disclosure.

The mode control signal MODE is used to control the S25, the S26, and the S30 in the main drive circuit to be turned off, and control the S27, the S28, the S29, and the S31 to be turned on; in this case, the main drive circuit works in the working mode 3. Because the two resistors R23 and R24 have relatively large resistances, there is no impact on the circuit in this working mode. A simplified schematic circuit diagram is shown in FIG. 9.

A supply voltage in this working mode is VDD_LV, and a working principle in this working mode is similar to that in the working mode 2. When the vpre_n is a positive signal, a path that a current in the circuit passes through is IIN:R22→S22→I21, and a path that a drive current in the circuit passes through is IOUT:R21→RL (a load resistor)→S22→I21. When the vpre_n is a negative signal, a path that a current in the circuit passes through is IIN:R21→S21→I21, and a path that a drive current in the circuit passes through is IOUT:R22→RL (a load resistor)→S21→I21.

Resistances of the R21/R22 are R, and a current value of the current source I21 is I, the drive current IOUT that passes through the load resistor RL is IR/(2R+RL), and a voltage swing VSWING generated by the current on the load resistor RL is IOUT×RL. If the load resistance RL is 100Ω and R is 50Ω, the drive current IOUT is VSWING/100, and the total current I in the circuit is 4×IOUT.

Optionally, when the non-movable end 1 of the S32 is connected to the movable end 2, the OP3 is connected to the main drive circuit. In this case, the main drive circuit can output a relatively low VCM.

A difference between the working mode 3 and the working mode 2 lies in: In the working mode 3, the supply voltage VDD_LV of a relatively low voltage is used, and therefore power consumption is reduced; and the output common-mode voltage VCM cannot change, that is, VCM=VDD_LV−VSWING/2. The drive current in this working mode is relatively large, and therefore this working mode is applicable to a high-speed communications system.

Figure 10:
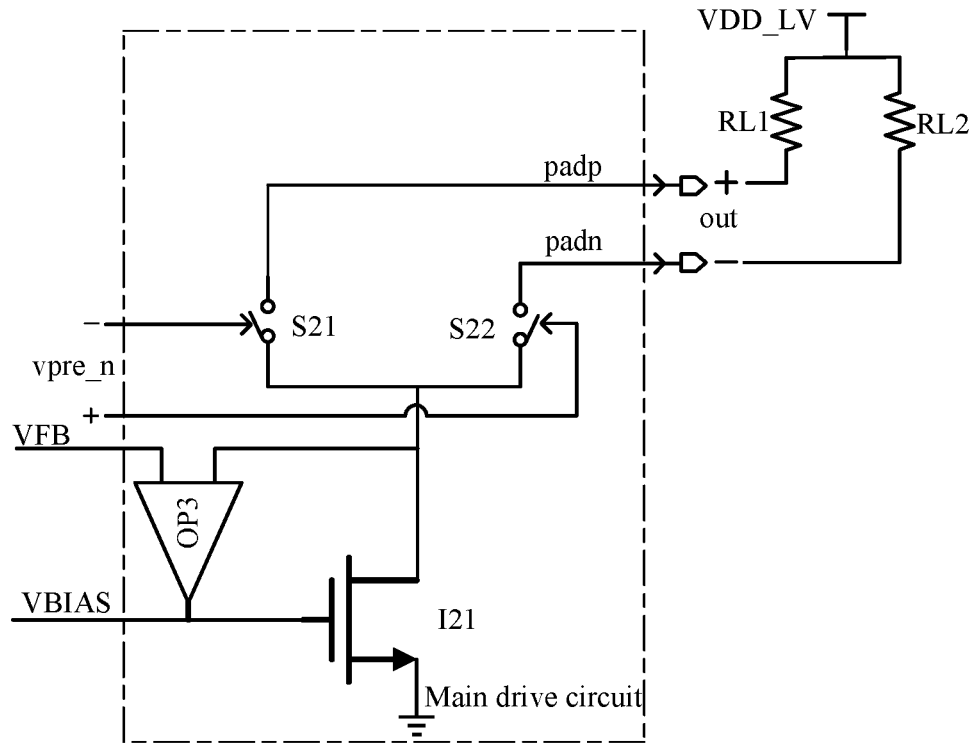
FIG. 10 is a schematic circuit diagram corresponding to a working mode 4 of a main drive circuit according to an aspect of the present disclosure.

Referring to FIG. 10, FIG. 10 is a schematic circuit diagram corresponding to a working mode 4 of a main drive circuit according to an aspect of the present disclosure.

The mode control signal MODE is used to control the S25, the S26, the S30, the S27, the S28, and the S31 to be turned off, control the S29 to be turned on, and control the SL in the load module to be turned on; in this case, the main drive circuit works in a working mode 4. Because of relatively large resistances of the two resistors R23 and R24, impact is not exerted on the circuit in this working mode and may be ignored. A simplified schematic circuit diagram is shown in FIG. 10.

A power supply in this working mode is provided by the supply voltage VDD_LV in the load module. Compared with that in the working mode 3, in this working mode, the resistors R21 and R22 in the main drive circuit are disconnected from an output end, and it is equivalent to that the resistors R21 and R22 are removed from the main drive circuit.

When the vpre_n is a positive signal, a path that a drive current passes through is IOUT:RL2 (a load resistor)→S22→I21. When the vpre_n is a negative signal, a path that a drive current passes through is IOUT:RL1 (a load resistor)→S21→I21. Resistances of the load resistors RL1/PL2 are equal and are set to RL; a current value of the current source I21 is I, a voltage generated at a load end is VH=VDD_LV; VL=VSWING=I×RL. A common-mode voltage of the main drive circuit is invariable, and VCM=VDD_LV−VSWING/2. The drive current in this working mode is relatively small, and therefore this working mode is applicable to a low-speed communications system.

Corresponding to the foregoing aspect of the drive circuit for the serial communications system, the present disclosure further provides an embodiment of a driving method for the serial communications system.

Figure 11:
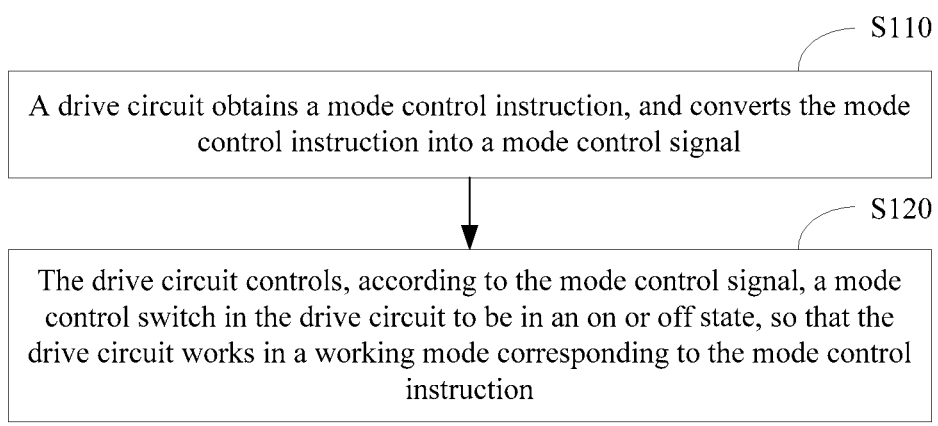
FIG. 11 is a flowchart of a driving method for a serial communications system according to an aspect of the present disclosure.

Referring to FIG. 11, FIG. 11 is a flowchart of a driving method for a serial communications system according to an aspect of the present disclosure. The method may be implemented by the foregoing drive circuit. As shown in FIG. 11, the method may include the following steps.

S110. The drive circuit obtains a mode control instruction, and converts the mode control instruction into a mode control signal.

A user may select a working mode. A central processing unit in the drive circuit generates a corresponding mode control instruction after detecting a selection operation of the user, and provides the mode control instruction for a mode controller.

The mode control instruction is a digital signal. The mode controller converts the mode control instruction into the mode control signal. The mode control signal is an analog signal, and includes multiple control signals used to control on/off states of switches.

S120. The drive circuit controls, according to the mode control signal, a mode control switch in the drive circuit to be in an on or off state, so that the drive circuit works in a working mode corresponding to the mode control instruction.

The mode control signal is used to control the on/off states of the mode control switches in the main drive circuit, so that a corresponding circuit component of the main drive circuit is connected to the drive circuit, and the main drive circuit works in a working mode corresponding to the mode control signal and outputs a drive parameter complying with a transmission protocol standard corresponding to the working mode.

For a specific process in which the main drive circuit is controlled, according to the mode control signal, to work in a working mode corresponding to the mode control signal, reference is made to the foregoing aspect of the drive circuit. Details are not described herein again.

According to the driving method for the serial communications system that is provided in this embodiment, the mode control instruction is obtained, the mode control instruction is converted into the mode control signal, and the mode control signal is used to control the on/off states of the mode control switches in the main drive circuit, so that the main drive circuit works in corresponding working modes. In the driving method, the mode control switches in the main drive circuit are controlled, so that the main drive circuit works in working modes corresponding to different transmission protocol standards. Therefore, only one chip is needed to support different transmission protocol standards, with a simple layout, low costs, and high reliability.

With reference to the first aspect, in a first possible implementation of the first aspect, the differential control signal output by the pre-drive circuit includes a first differential control signal and a second differential control signal, and a common-mode voltage of the first differential control signal is higher than a common-mode voltage of the second differential control signal; and the main drive circuit includes: a first input end of a first differential operational amplifier receives a first reference common-mode voltage, a second input end receives a common-mode voltage output by the main drive circuit, an output end is connected to a control end of a first current source by using a first control switch, and the first differential operational amplifier is configured to make the common-mode voltage output by the main drive circuit equal to the first reference common-mode voltage; an input end of the first current source is connected to a first power source and the input end is connected to the control end of the first current source by using a second control switch, and an output end of the first current source is a first node; a second power source is connected to the first node by using a third control switch; an input end of a second current source is a second node, an output end is grounded, a control end receives a first bias voltage, and a current in the second current source is a total current in the main drive circuit; a first differential switch and a fourth differential switch are connected in series between the first node and the second node, and a second differential switch and a third differential switch are connected in series between the first node and the second node; the third differential switch and the fourth differential switch receive the first differential control signal respectively by using a fourth control switch and a fifth control switch, and the first differential control signal is used to control the third differential switch or the fourth differential switch to be in an on or off state; a control end of the first differential switch and a control end of the second differential switch receive the second differential control signal, and the second differential control signal is used to control the first differential switch or the second differential switch to be in an on or off state; and a first resistor and a sixth control switch are connected in series between the first node and a positive output end of the main drive circuit, and a second resistor and a seventh control switch are connected in series between the first node and a negative output end of the main drive circuit.

With reference to the first possible implementation of the first aspect, in a second possible implementation of the first aspect, if the mode control signal is a first mode control signal, the main drive circuit is configured to: control the first control switch, the fourth control switch, and the fifth control switch to be turned on, and control the second control switch, the third control switch, the sixth control switch, and the seventh control switch to be turned off, so that the common-mode voltage of the drive signal output by the main drive circuit is equal to the first reference common-mode voltage, and a current of the first current source is equal to that of the second current source; and a current in the first current source passes through the first differential switch and the third differential switch, or passes through the second differential switch and the fourth differential switch, and is transmitted to a load connected to the positive and negative output ends of the main drive circuit.

With reference to the first possible implementation of the first aspect, in a third possible implementation of the first aspect, if the mode control signal is a second mode control signal, the main drive circuit is configured to: control the first control switch, the sixth control switch, and the seventh control switch to be turned on, and control the second control switch, the third control switch, the fourth control switch, and the fifth control switch to be turned off, so that the common-mode voltage of the drive signal output by the main drive circuit is equal to the first reference common-mode voltage, and a current in the first current source is equal to that in the second current source; one part of the current in the first current source passes through the first resistor and the second differential switch, or passes through the second resistor and the first differential switch, and is transmitted to a load connected to the positive and negative output ends of the main drive circuit; and the other part of the current in the first current source passes through a branch circuit that is formed by the second resistor and the second differential switch that are connected in series or passes through a branch circuit that is formed by the first resistor and the first differential switch that are connected in series.

With reference to the first possible implementation of the first aspect, in a fourth possible implementation of the first aspect, if the mode control signal is a third mode control signal, the main drive circuit is configured to: control the second control switch, the third control switch, the sixth control switch, and the seventh control switch to be turned on, and control the first control switch, the fourth control switch, and the fifth control switch to be turned off, so that one part of the current in the second current source passes through the first resistor and the second differential switch, or passes through the second resistor and the first differential switch, and is transmitted to a load connected to the positive and negative output ends of the main drive circuit; and the other part of the current in the second current source passes through the first resistor and the first differential switch or passes through the second resistor and the second differential switch.

With reference to the first possible implementation of the first aspect, in a fifth possible implementation of the first aspect, if a first load resistor and a second load resistor that are in a load module connected to the output ends of the main drive circuit are connected in series, a junction of the first load resistor and the second load resistor is connected to the second power source; and if the mode control signal is a fourth mode control signal, the main drive circuit is configured to:

control all of the first control switch, the second control switch, the third control switch, the fourth control switch, the fifth control switch, the sixth control switch, and the seventh control switch to be turned off, so that the current in the second current source passes through the first differential switch and is transmitted to the first load resistor, or passes through the second differential switch and is transmitted to the second load resistor.

With reference to the first possible implementation of the first aspect, in a sixth possible implementation of the first aspect, the main drive circuit further includes a second differential operational amplifier and an eighth control switch, where a first input end of the second differential operational amplifier receives a second bias voltage, a second input end is connected to the second node, an output end generates the first bias voltage by using the eighth control switch, and the second differential operational amplifier is configured to make the second bias voltage equal to a voltage at the second node, so that the second current source is a mirror current source of a current source generating the first bias voltage.

With reference to the first possible implementation of the first aspect, in a seventh possible implementation of the first aspect, the main drive circuit further includes a compensation capacitor, where one end of the compensation capacitor is connected to the first input end of the first differential operational amplifier, and the other end of the compensation capacitor is connected to the output end of the first differential operational amplifier.

With reference to the first possible implementation of the first aspect, in an eighth possible implementation of the first aspect, the pre-drive circuit includes a first pre-drive circuit and a second pre-drive circuit, where the first pre-drive circuit is configured to convert the differential digital signal into the first differential control signal, and provide the first differential control signal for the first differential switch and the second differential switch; and the second pre-drive circuit is configured to convert the differential digital signal into the second differential control signal, and provide the second differential control signal for the third differential switch and the fourth differential switch.

With reference to the eighth possible implementation of the first aspect, in a ninth possible implementation of the first aspect, the second pre-drive circuit includes: an input end of a third current source is connected to the first power source, and an output end is a third node; a first input end of a third differential operational amplifier receives a second reference common-mode voltage, a second input end is connected to the third node, an output end is connected to a control end of the third current source, and the third differential operational amplifier is configured to make a voltage at the third node equal to the second reference common-mode voltage; an input end of a fourth current source is a fourth node, and an output end of the fourth current source is connected to a ground terminal; a third resistor and a fifth differential switch are connected in series between the third node and the fourth node, and a fourth resistor and a sixth differential switch are connected in series between the third node and the fourth node; and a control end of the fifth differential switch and a control end of the sixth differential switch separately receive the differential digital signal, a junction of the third resistor and the fifth differential switch is a first output end of the second pre-drive circuit, a junction of the fourth resistor and the sixth differential switch is a second output end of the second pre-drive circuit, and the differential digital signal is used to: control the fifth differential switch or the sixth differential switch to be in an on or off state, and make the first output end and the second output end output the first differential control signal.

With reference to the first aspect, in an tenth possible implementation of the first aspect, the drive circuit further includes: a first reference voltage generation circuit, configured to: generate the first reference common-mode voltage, and transmit the first reference common-mode voltage to the main drive circuit; and a bias voltage generation circuit, configured to: generate the first bias voltage and a second bias voltage, and transmit the first bias voltage and the second bias voltage to the main drive circuit.

With reference to the tenth possible implementation of the first aspect, in an eleventh possible implementation of the first aspect, the bias voltage generation circuit includes a first reference current source and a fifth current source, where the first reference current source and the fifth current source are connected in series between the second power source and a ground terminal, a voltage at a junction of the first reference current source and the fifth current source is the second bias voltage, and a voltage at a control end of the fifth current source is the first bias voltage.

With reference to the first aspect, in a twelfth possible implementation of the first aspect, the drive circuit further includes a second reference voltage generation circuit, configured to: generate the second reference common-mode voltage, and transmit the second reference common-mode voltage to the second pre-drive circuit.

With reference to the second aspect, in a first possible implementation of the second aspect, the drive circuit includes a main drive circuit, and the main drive circuit includes: a first input end of a first differential operational amplifier receives a first reference common-mode voltage, a second input end receives a common-mode voltage output by the main drive circuit, an output end is connected to a control end of a first current source by using a first control switch, and the first differential operational amplifier is configured to make the common-mode voltage output by the main drive circuit equal to the first reference common-mode voltage; an input end of the first current source is connected to a first power source and the input end is connected to the control end of the first current source by using a second control switch, and an output end of the first current source is a first node; a second power source is connected to the first node by using a third control switch; an input end of a second current source is a second node, an output end is grounded, a control end receives a first bias voltage, and a current in the second current source is a total current in the main drive circuit; a first differential switch and a fourth differential switch are connected in series between the first node and the second node, and a second differential switch and a third differential switch are connected in series between the first node and the second node; the third differential switch and the fourth differential switch receive a first differential control signal respectively by using a fourth control switch and a fifth control switch, and the first differential control signal is used to control the third differential switch or the fourth differential switch to be in an on or off state; a control end of the first differential switch and a control end of the second differential switch receive a second differential control signal, and the second differential control signal is used to control the first differential switch or the second differential switch to be in an on or off state; and a first resistor and a sixth control switch are connected in series between the first node and a positive output end of the main drive circuit, and a second resistor and a seventh control switch are connected in series between the first node and a negative output end of the main drive circuit.

With reference to the second aspect, in a second possible implementation of the second aspect, the controlling, by the drive circuit according to the mode control signal, a mode control switch in the drive circuit to be in an on or off state, so that the drive circuit works in a working mode corresponding to the mode control instruction includes: controlling the first control switch, the fourth control switch, and the fifth control switch to be turned on, and controlling the second control switch, the third control switch, the sixth control switch, and the seventh control switch to be turned off, so that the common-mode voltage of the drive signal output by the drive circuit is equal to the first reference common-mode voltage, and a current of the first current source is equal to that of the second current source; and a current in the first current source passes through the first differential switch and the third differential switch, or passes through the second differential switch and the fourth differential switch, and is transmitted to a load connected to the positive and negative output ends of the main drive circuit.

With reference to the second aspect, in a third possible implementation of the second aspect, the controlling, by the drive circuit according to the mode control signal, a mode control switch in the drive circuit to be in an on or off state, so that the drive circuit works in a working mode corresponding to the mode control instruction includes: controlling the first control switch, the sixth control switch, and the seventh control switch to be turned on, and controlling the second control switch, the third control switch, the fourth control switch, and the fifth control switch to be turned off, so that the common-mode voltage of the drive signal output by the main drive circuit is equal to the first reference common-mode voltage, and a current in the first current source is equal to that in the second current source; one part of the current in the first current source passes through the first resistor and the second differential switch, or passes through the second resistor and the first differential switch, and is transmitted to a load connected to the positive and negative output ends of the main drive circuit; and the other part of the current in the first current source passes through a branch circuit that is formed by the second resistor and the second differential switch that are connected in series or passes through a branch circuit that is formed by the first resistor and the first differential switch that are connected in series.

With reference to the second aspect, in a fourth possible implementation of the second aspect, the controlling, by the drive circuit according to the mode control signal, a mode control switch in the drive circuit to be in an on or off state, so that the drive circuit works in a working mode corresponding to the mode control instruction includes: controlling the second control switch, the third control switch, the sixth control switch, and the seventh control switch to be turned on, and controlling the first control switch, the fourth control switch, and the fifth control switch to be turned off, so that one part of the current in the second current source passes through the first resistor and the second differential switch, or passes through the second resistor and the first differential switch, and is transmitted to a load connected to the positive and negative output ends of the main drive circuit; and the other part of the current in the second current source passes through the first resistor and the first differential switch or passes through the second resistor and the second differential switch.

With reference to the second aspect, in a fifth possible implementation of the second aspect, the controlling, by the drive circuit according to the mode control signal, a mode control switch in the drive circuit to be in an on or off state, so that the drive circuit works in a working mode corresponding to the mode control instruction includes: controlling all of the first control switch, the second control switch, the third control switch, the fourth control switch, the fifth control switch, the sixth control switch, and the seventh control switch to be turned off, so that the current in the second current source passes through the first differential switch and is transmitted to the first load resistor, or passes through the second differential switch and is transmitted to the second load resistor.

The drive circuit for the serial communications system that is provided in embodiments of this application includes the mode controller, the pre-drive circuit, and the main drive circuit. The main drive circuit includes the multiple mode control switches and the at least one pair of differential switches. The mode controller is configured to: generate the mode control signal, and transmit the mode control signal to the main drive circuit. The pre-drive circuit is configured to: convert the received differential digital signal into the differential control signal, and transmit the differential control signal to the main drive circuit. The main drive circuit controls, according to the mode control signal, the multiple mode control switches to be in an on or off state, so that the main drive circuit works in a working mode corresponding to the mode control signal. In addition, the main drive circuit controls, according to the differential control signal, the at least one pair of differential switches to be in an on or off state, and converts the differential digital signal into a drive signal corresponding to a current working mode. The drive circuit controls the states of the mode control switches in the main drive circuit, so that the main drive circuit works in working modes corresponding to different transmission protocol standards. Therefore, only one chip is needed to support different transmission protocol standards, with a simple layout, low costs, and high reliability.

For ease of description, the foregoing method embodiments are expressed as a series of actions. However, a person skilled in the art should appreciate that the present disclosure is not limited to the described action sequence, because according to the present disclosure, some steps may be performed in other sequences or performed simultaneously. In addition, a person skilled in the art should also appreciate that all the embodiments described in this specification are embodiments, and the related actions and modules are not necessarily mandatory to the present disclosure.

It should be noted that the embodiments in this specification are all described in a progressive manner, each embodiment focuses on a difference from other embodiments. For same or similar parts in the embodiments, reference may be made to these embodiments. An apparatus embodiment is basically similar to a method embodiment, and therefore is described briefly. For related parts, reference may be made to partial descriptions in the method embodiment.

Finally, it should be additionally noted that in this specification, relational terms such as first and second are only used to distinguish one entity or operation from another, and do not necessarily require or imply that any actual relationship or sequence exists between these entities or operations. Moreover, the terms "include", "comprise", or their any other variant is intended to cover a non-exclusive inclusion, so that a process, a method, an article, or a device that includes a list of elements not only includes those elements but also includes other elements which are not expressly listed, or further includes elements inherent to such process, method, article, or device. An element preceded by a sentence "includes a . . . " does not, without more constraints, preclude the existence of additional identical elements in the process, method, article, or device that includes the element.

The embodiments disclosed above are described to enable a person skilled in the art to implement or use the present disclosure. Various modifications to the embodiments are obvious to the person skilled in the art, and general principles defined in this specification may be implemented in other embodiments without departing from the spirit or scope of the present disclosure. Therefore, the present disclosure is not limited to the embodiments described in this specification but extends to the widest scope that complies with the principles and novelty disclosed in this specification.

The foregoing descriptions are merely implementations of the present disclosure. It should be noted that a person of ordinary skill in the art may make several improvements or polishing without departing from the principle of the present disclosure and the improvements or polishing shall fall within the protection scope of the present disclosure.

What is claimed is:

1. A drive circuit for a serial communications system, comprising:
   a main drive circuit comprising multiple mode control switches and at least one pair of differential switches;
   a mode controller coupled to the main drive circuit and configured to:
      generate a mode control signal, wherein the mode control signal indicates a working mode of the main drive circuit; and
      transmit the mode control signal to the main drive circuit;
   a pre-drive circuit coupled to the main drive circuit and configured to:
      convert a differential digital signal into a differential control signal used to control the at least one pair of differential switches, wherein the differential control signal comprises a first differential control signal and a second differential control signal, and wherein a first common-mode voltage of the first differential control signal is higher than a second common-mode voltage of the second differential control signal; and
      transmit the differential control signal to the main drive circuit; and
   wherein the main drive circuit is configured to:
      control, according to the mode control signal, the multiple mode control switches so that the main drive circuit works in the working mode corresponding to the mode control signal;
      control the at least one pair of differential switches according to the differential control signal; and
      convert the differential digital signal into a drive signal in the working mode corresponding to the mode control signal.

2. The drive circuit of claim 1, wherein the main drive circuit comprises:
   a first differential operational amplifier having a first input end, a second input end, and a first output end, wherein the first input end is configured to receive a first reference common-mode voltage, wherein the second input end is configured to receive a third common-mode voltage from the main drive circuit, and wherein the first differential operational amplifier is configured to make the third common-mode voltage equal to the first reference common-mode voltage; and
   a first current source having a third input end, a second output end, and a first control end, wherein the first output end is coupled to the first control end via a first control switch, wherein the third input end is coupled to the first control end via a second control switch and to a first power source, and wherein the second output end is a first node.

3. The drive circuit of claim 2, wherein the main drive circuit further comprises:
   a second power source coupled to the first node via a third control switch; and
   a second current source having a fourth input end, a third output end, and a second control end, wherein the fourth input end is a second node, wherein the third output end is grounded, wherein the second control end is configured to receive a first bias voltage, and wherein a current in the second current source is a total current in the main drive circuit.

4. The drive circuit of claim 3, wherein the main drive circuit further comprises:
   a first differential switch having a third control end;
   a second differential switch having a fourth control end, wherein the third control end and the fourth control end are configured to receive the second differential control signal, and wherein the second differential control signal is used to control either the first differential switch or the second differential switch to be in an on state or an off state;
   a third differential switch, wherein the second differential switch and the third differential switch are coupled in series between the first node and the second node;
   a fourth differential switch, wherein the first differential switch and the fourth differential switch are coupled in series between the first node and the second node, wherein the third differential switch and the fourth differential switch receive the first differential control signal, respectively, using a fourth control switch and a fifth control switch, and wherein the first differential control signal is used to control either the third differential switch or the fourth differential switch to be in the on state or the off state;

a first resistor, wherein the first resistor and a sixth control switch are coupled in series between the first node and a positive output end of the main drive circuit; and a second resistor, wherein the second resistor and a seventh control switch are coupled in series between the first node and a negative output end of the main drive circuit.

5. The drive circuit of claim 4, wherein the mode control signal is a first mode control signal, and wherein the main drive circuit is configured to:

control the first control switch, the fourth control switch, and the fifth control switch to be turned on; and control the second control switch, the third control switch, the sixth control switch, and the seventh control switch to be turned off, wherein a first current of the first current source is equal to a second current of the second current source, wherein the current in the first current source either (a) passes through the first differential switch and the third differential switch or (b) passes through the second differential switch and the fourth differential switch, and wherein the current in the first current source is transmitted to a load coupled to the positive output end and the negative output ends.

6. The drive circuit of claim 4, wherein the mode control signal is a second mode control signal, and wherein the main drive circuit is configured to:

control the first control switch, the sixth control switch, and the seventh control switch to be turned on; and control the second control switch, the third control switch, the fourth control switch, and the fifth control switch to be turned off, wherein a first current of the first current source is equal to a second current of the second current source, wherein one part of the current in the first current source either (a) passes through the first resistor and the second differential switch or (b) passes through the second resistor and the first differential switch, wherein the one part of the current in the first current source is transmitted to a load coupled to the positive output end and the negative output end, and wherein another part of the current in the first current source either (a) passes through a first branch circuit that is formed by the second resistor and the second differential switch, which are coupled in series or (b) passes through a second branch circuit that is formed by the first resistor and the first differential switch, which are coupled in series.

7. The drive circuit of claim 4, wherein the mode control signal is a third mode control signal, and wherein the main drive circuit is configured to:

control the second control switch, the third control switch, the sixth control switch, and the seventh control switch to be turned on; and control the first control switch, the fourth control switch, and the fifth control switch to be turned off, wherein one part of the current in the second current source either (a) passes through the first resistor and the second differential switch or (b) passes through the second resistor and the first differential switch, wherein the one part of the current in the second current source is transmitted to a load coupled to the positive output end and the negative output end, and wherein another part of the current in the second current source either (a) passes through the first resistor and the first differential switch or (b) passes through the second resistor and the second differential switch.

8. The drive circuit of claim 4, wherein a first junction of a first load resistor and a second load resistor is coupled to the second power source when the first load resistor and the second load resistor that are in a load module connected coupled to the positive output end and the negative output end are coupled in series, and wherein when the mode control signal is a fourth mode control signal, the main drive circuit is configured to control all of the first control switch, the second control switch, the third control switch, the fourth control switch, the fifth control switch, the sixth control switch, and the seventh control switch to be turned off so that the current in the second current source either (a) passes through the first differential switch and is transmitted to the first load resistor or (b) passes through the second differential switch and is transmitted to the second load resistor.

9. The drive circuit of claim 4, wherein the main drive circuit further comprises:

a second differential operational amplifier having a fifth input end, a sixth input end, and a fourth output end, wherein the fifth input end is configured to receive a second bias voltage, and wherein the sixth input end is coupled to the second node; and an eighth control switch, wherein the fourth output end is configured to generate the first bias voltage using the eighth control switch, and wherein the second differential operational amplifier is configured to make the second bias voltage equal to a voltage at the second node so that the second current source is a mirror current source of a current source generating the first bias voltage.

10. The drive circuit of claim 4, wherein the main drive circuit further comprises a compensation capacitor, wherein one end of the compensation capacitor is coupled to the first input end, and wherein another end of the compensation capacitor is coupled to the first output end.

11. The drive circuit of claim 4, wherein the pre-drive circuit comprises:

a first pre-drive circuit configured to:
 convert the differential digital signal into the first differential control signal; and
 provide the first differential control signal for the first differential switch and the second differential switch; and a second pre-drive circuit configured to:
 convert the differential digital signal into the second differential control signal; and
 provide the second differential control signal for the third differential switch and the fourth differential switch.

12. The drive circuit of claim 11, wherein the second pre-drive circuit comprises:

a third current source having a seventh input end, a fifth output end, and a fifth control end, wherein the seventh input end is coupled to the first power source, and wherein the fifth output end is a third node;

a third differential operational amplifier having an eighth input end, a ninth input end, and a sixth output end, wherein the eighth input end is configured to receive a second reference common-mode voltage, wherein the ninth input end is coupled to the third node, wherein the sixth output end is coupled to the fifth control end, and wherein the third differential operational amplifier is configured to make a voltage at the third node equal to the second reference common-mode voltage;

a fourth current source having a tenth input end and an seventh output end, wherein the tenth input end is a fourth node, and wherein the seventh output end is coupled to a ground terminal;

a third resistor;

a fourth resistor a fifth differential switch having a sixth control end, wherein the third resistor and the fifth differential switch are coupled in series between the third node and the fourth node, and wherein a second junction of the third resistor and the fifth differential switch is a second pre-drive circuit first output; and a sixth differential switch having a seventh control end, wherein the fourth resistor and the sixth differential switch are coupled in series between the third node and the fourth node, wherein the sixth control end and seventh control end are configured to separately receive the differential digital signal, and wherein a third junction of the fourth resistor and the sixth differential switch is a second pre-drive circuit second output, and wherein the differential digital signal is used to:
control the fifth differential switch or the sixth differential switch to be in the on state or the off state; and
make the first output end and the second output end output the first differential control signal.

13. The drive circuit of claim 4, further comprising:
a first reference voltage generation circuit configured to:
generate the first reference common-mode voltage; and
transmit the first reference common-mode voltage to the main drive circuit; and
a bias voltage generation circuit configured to:
generate the first bias voltage and a second bias voltage; and
transmit the first bias voltage and the second bias voltage to the main drive circuit.

14. The drive circuit of claim 13, wherein the bias voltage generation circuit comprises a first reference current source and a fifth current source, wherein the first reference current source and the fifth current source are coupled in series between the second power source and a ground terminal, wherein a first voltage at a fourth junction of the first reference current source and the fifth current source is the second bias voltage, and wherein a second voltage at a control end of the fifth current source is the first bias voltage.

15. The drive circuit of claim 12, further comprising a second reference voltage generation circuit configured to:
generate the second reference common-mode voltage; and
transmit the second reference common-mode voltage to the second pre-drive circuit.

16. A method for driving a serial communications system, comprising:
obtaining, by a drive circuit, a mode control instructions;
converting the mode control instruction into a mode control signal;
converting a differential digital signal into a differential control signal used to control at least one pair of differential switches, wherein the differential control signal comprises a first differential control signal and a second differential control signal, and wherein a first common-mode voltage of the first differential control signal is higher than a second common-mode voltage of the second differential control signal; and controlling, by the drive circuit according to the mode control signal, a mode control switch in the drive circuit so that the drive circuit works in a working mode corresponding to the mode control instruction.

17. The method of claim 16, further comprising:
transmitting the differential control signal to a main drive circuit;
controlling, the at least one pair of differential switches according to the differential control signal; and
converting the differential digital signal into a drive signal in the working mode corresponding to the mode control signal.

18. The method of claim 17, wherein the main drive circuit comprises a first differential operational amplifier, and wherein the method further comprises:
receiving, by the first differential operational amplifier, a first reference common-mode voltage;
receiving, by the first differential operational amplifier, a third common-mode voltage from the main drive circuit; and
making, by the first differential operational amplifier, the third common-mode voltage equal to the first reference common-mode voltage.

19. A method for driving a serial communications system, comprising:
providing a drive circuit comprising a mode controller, a pre-drive circuit, and a main drive circuit, wherein the main drive circuit comprises multiple mode control switches and at least one pair of differential switches, and wherein the drive circuit is configured to provide different drive signals in a plurality of working modes;
generating, by the mode controller, a mode control signal;
transmitting, by the mode controller, the mode control signal to the main drive circuit, wherein the mode control signal indicates a working mode of the main drive circuit;
converting, by the pre-drive circuit, a differential digital signal into a differential control signal configured to control the at least one pair of differential switches, wherein the differential control signal comprises a first differential control signal and a second differential control signal, and wherein a first common-mode voltage of the first differential control signal is higher than a second common-mode voltage of the second differential control signal;
transmitting, by the pre-drive circuit, the differential control signal to the main drive circuit;
controlling, by the main drive circuit according to the mode control signal, the multiple mode control switches to cause the main drive circuit to work in one of the plurality of working modes corresponding to the mode control signal;
controlling, by the main drive circuit, the at least one pair of differential switches according to the differential control signal; and
converting, by the main drive circuit, the differential digital signal into a drive signal in the working mode corresponding to the mode control signal.

20. The method of claim 19, wherein the main drive circuit comprises a first differential operational amplifier, and the method further comprises:
receiving, by a first input end of the first differential operational amplifier, a first reference common-mode voltage;
receiving, by a second input end of the first differential operational amplifier, a third common-mode voltage from the main drive circuit; and making, by the first differential operational amplifier, the third common-mode voltage equal to the first reference common-mode voltage.

\* \* \* \* \*